United States Patent
Grupp et al.

(10) Patent No.: US 7,308,630 B2
(45) Date of Patent: Dec. 11, 2007

(54) MECHANISM TO PROVIDE TEST ACCESS TO THIRD-PARTY MACRO CIRCUITS EMBEDDED IN AN ASIC (APPLICATION-SPECIFIC INTEGRATED CIRCUIT)

(75) Inventors: Richard J. Grupp, Milton, VT (US); Kelly A. Ockunzzi, Essex Junction, VT (US); Mark R. Taylor, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 219 days.

(21) Appl. No.: 10/906,467

(22) Filed: Feb. 22, 2005

(65) Prior Publication Data

US 2006/0190782 A1 Aug. 24, 2006

(51) Int. Cl.
*G01R 31/28* (2006.01)
(52) U.S. Cl. .................. 714/725; 714/729; 714/732
(58) Field of Classification Search ............... 714/725, 714/729, 732
See application file for complete search history.

(56) References Cited

U.S. PATENT DOCUMENTS

| | | | |
|---|---|---|---|
| 4,878,209 A | 10/1989 | Bassett et al. | |
| 5,331,571 A | 7/1994 | Aronoff et al. | |
| 5,392,297 A | 2/1995 | Bell et al. | |
| 5,663,965 A | 9/1997 | Seymour | |
| 5,668,817 A * | 9/1997 | Adham | 714/732 |
| 5,790,561 A | 8/1998 | Borden et al. | |
| 5,799,021 A | 8/1998 | Gheewala | |
| 5,844,917 A * | 12/1998 | Salem et al. | 714/724 |
| 5,968,190 A | 10/1999 | Knaack | |
| 5,973,976 A | 10/1999 | Sato | |
| 6,020,755 A * | 2/2000 | Andrews et al. | 326/39 |
| 6,249,889 B1 | 6/2001 | Rajsuman et al. | |
| 6,311,299 B1 | 10/2001 | Bunker | |
| 6,438,722 B1 | 8/2002 | Bailey et al. | |
| 6,744,274 B1 * | 6/2004 | Arnold et al. | 326/16 |
| 6,944,836 B1 * | 9/2005 | Lai | 716/4 |
| 7,047,464 B2 * | 5/2006 | Bailis et al. | 714/725 |

OTHER PUBLICATIONS

Savkar, A.D.; N-Way Testpoint for Complex LSI Design; IBM Technical Disclosure Bulletin; vol. 14; No. 10; Mar. 1972; pp. 2937-2938.
Pruden, D.W. and Sweet, C.P.; Specification of Device Isolation Requirements by Operation; IBM Technical Disclosure Bulletin; vol. 28; No. 3; Aug. 1985; pp. 1178-1179.

* cited by examiner

*Primary Examiner*—Joseph D. Torres
(74) *Attorney, Agent, or Firm*—Schmeiser, Olsen & Watts; Anthony J. Canale (57) ABSTRACT

Novel structures and testing methods for the FPGAs (Field-Programmable Gate Arrays) embedded in an ASIC (Application-Specific Integrated Circuit). Basically, a shift/interface system is coupled between the FPGAs and the ASIC. During normal operation, the shift/interface system electrically couples the FPGAs to the ASIC. During the testing of the FPGAs, the shift/interface system scans in FPGA test data in series, then feeds the FPGA test data to the FPGAs, then receives FPGA response data from the FPGAs, and then scans out the FPGA response data in series. During the testing of the ASIC, the shift/interface system scans in ASIC test data in series, then feeds the ASIC test data to the ASIC, then receives ASIC response data from the ASIC, and then scans out the ASIC response data in series.

5 Claims, 5 Drawing Sheets

MECHANISM TO PROVIDE TEST ACCESS TO THIRD-PARTY MACRO CIRCUITS EMBEDDED IN AN ASIC (APPLICATION-SPECIFIC INTEGRATED CIRCUIT)

BACKGROUND OF THE INVENTION

1. Technical Field

The present invention relates to FPGAs (Field-Programmable Gate Arrays), and more particularly, to testing of FPGAs embedded in an ASIC (Application-Specific Integrated Circuit).

2. Related Art

An FPGA (Field-Programmable Gate Array) and an ASIC (Application-Specific Integrated Circuit) can be combined to form a hybrid IC (integrated circuit) so that the hybrid IC can have the advantages of both the FPGA (design flexibility) and the ASIC (low power, high performance, and low test pin count).

Testing a standalone FPGA typically consists of exhaustively testing the logic blocks and interconnect resources of the FPGA through a series of structural tests. These structural tests configure the standalone FPGA in different ways and require access to all input/output (I/O) pins of the standalone FPGA. Similarly, testing the FPGA in the hybrid IC consists of essentially the same structural tests. The problem is how to access all I/O pins of the FPGA in the hybrid IC given the low test pin count of the hybrid IC.

Therefore, there is a need for a novel structure and testing method for a low test pin count, hybrid IC comprising an ASIC and multiple FPGAs.

SUMMARY OF THE INVENTION

The present invention provides a digital system, comprising (a) N macro circuits, N being a positive integer; (b) an application-specific integrated circuit (ASIC); and (c) a shift/interface system being coupled to the N macro circuits and the ASIC, wherein, in response to the N macro circuits and the ASIC being in normal operation, the shift/interface system electrically couples each macro circuit of the N macro circuits to the ASIC, wherein, in response to the N macro circuits being tested, the shift/interface system is further configured to scan-in macro circuit test data in series, then to feed the macro circuit test data to the N macro circuits, then to receive macro circuit response data from the N macro circuits, and then to scan-out the macro circuit response data in series, and wherein, in response to the ASIC being tested, the shift/interface system is further configured to scan-in ASIC test data in series, then to feed the ASIC test data to the ASIC, then to receive ASIC response data from the ASIC, and then to scan-out the ASIC response data in series.

The present invention also provides a system testing and operating method, comprising the steps of (a) providing a digital system including (i) N macro circuits, (ii) an application-specific integrated circuit (ASIC), and (iii) a shift/interface system being coupled to the N macro circuits and the ASIC; (b) in response to the N macro circuits and the ASIC being in normal operation, using the shift/interface system to electrically couple each macro circuit of the N macro circuits to the ASIC; (c) in response to the N macro circuits being tested, (i) scanning-in macro circuit test data in series into the shift/interface system, (ii) feeding the macro circuit test data from the shift/interface system to the N macro circuits, (iii) using the shift/interface system to receive macro circuit response data from the N macro circuits, and (iv) scanning-out the macro circuit response data in series from the shift/interface system; and (d) in response to the ASIC being tested, (i) scanning-in ASIC test data in series into the shift/interface system, (ii) feeding the ASIC test data from the shift/interface system to the ASIC, (iii) using the shift/interface system to receive ASIC response data from the ASIC, and (iv) scanning-out the ASIC response data in series from the shift/interface system.

The present invention also provides a system testing method, comprising the steps of (a) providing a digital system including (i) a macro circuit, (ii) an application-specific integrated circuit (ASIC), and (iii) a shift/interface system being coupled to the macro circuit and the ASIC, and (iv) a multiple-input signature register (MISR) including K MISR stages, K being a positive integer, the K MISR stages being coupled together, being coupled to K output pins of the macro circuit, and being coupled to K shift/interface circuits of the shift/interface system, wherein the K shift/interface circuits are coupled together; (b) scanning-in macro circuit test data in series into the shift/interface system; (c) transmitting the macro circuit test data from the shift/interface system to the macro circuit in parallel; (d) using the macro circuit to process the macro circuit test data into macro circuit response data and to present the macro circuit response data at the K output pins of the macro circuit; (e) transmitting the macro circuit response data from the K output pins of the macro circuit to the K MISR stages; (f) using the MISR to process the macro circuit response data into a macro circuit response signature and send the macro circuit response signature to the K shift/interface circuits; and (g) scanning the macro circuit response signature out of the K shift/interface circuits in series.

The present invention provides a novel structure and testing method for a low test pin count, hybrid IC comprising an ASIC and multiple FPGAs.

DETAILED DESCRIPTION OF THE INVENTION

Figure 1A:
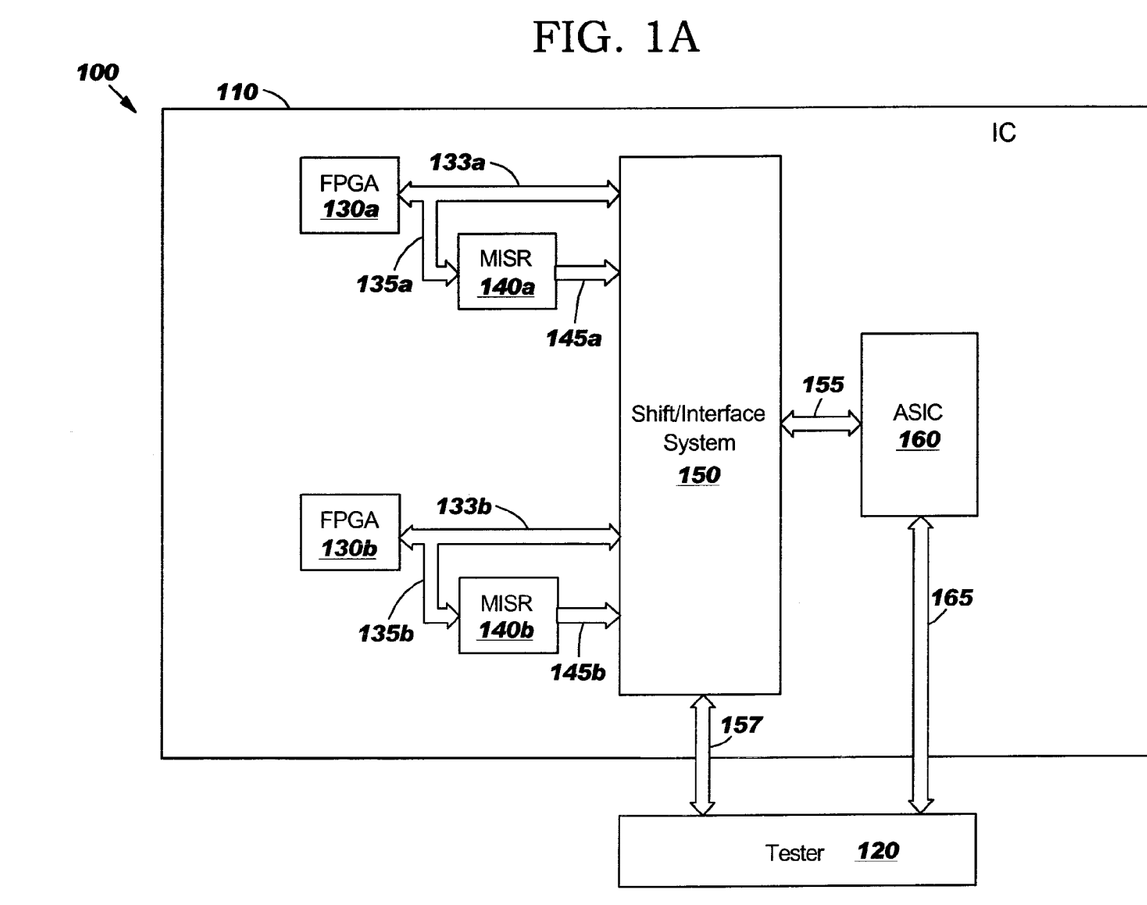
FIG. 1A illustrates a testing system comprising an IC (integrated circuit) and a tester, the IC comprising a shift/interface system, in accordance with embodiments of the present invention.

FIG. 1A illustrates a testing system 100 comprising an IC (integrated circuit) 110 and a tester 120, in accordance with embodiments of the present invention. In one embodiment, illustratively, the IC 110 can comprise FPGAs (Field-Programmable Gate Arrays) 130a and 130b, MISRs (Multiple-Input Signature Registers) 140a and 140b, a shift/interface system 150, and an ASIC (Application-Specific Integrated Circuit) 160. In general, the IC 110 can comprise M FPGAs similar to the FPGAs 130a and 130b, and M MISRs similar to the MISRs 140a and 140b (M is positive integer).

The FPGA 130a is coupled to the shift/interface system 150 via connections 133a and to the MISR 140a via connections 135a. The MISR 140a is coupled to the shift/interface system 150 via connections 145a. Similarly, the FPGA 130b is coupled to the shift/interface system 150 via connections 133b and to the MISR 140b via connections 135b. The MISR 140b is coupled to the shift/interface system 150 via connections 145b. The shift/interface system 150 is coupled to the ASIC 160 via connections 155 and to the tester 120 via connections 157. The ASIC 160 is coupled to the tester 120 via connections 165.

In one embodiment, during the normal operation of the IC 110 (i.e., the ASIC 160 and the FPGAs 130a and 130b are in normal operation), the shift/interface system 150 can be configured to (a) electrically couple the FPGAs 130a to the ASIC 160 via the connections 133a and 155 and (b) electrically couple the FPGAs 130b to the ASIC 160 via the connections 133b and 155. In other words, during the normal operation of the IC 110, the shift/interface system 150 is transparent to the FPGAs 130a and 130b and the ASIC 160.

Figure 1B:
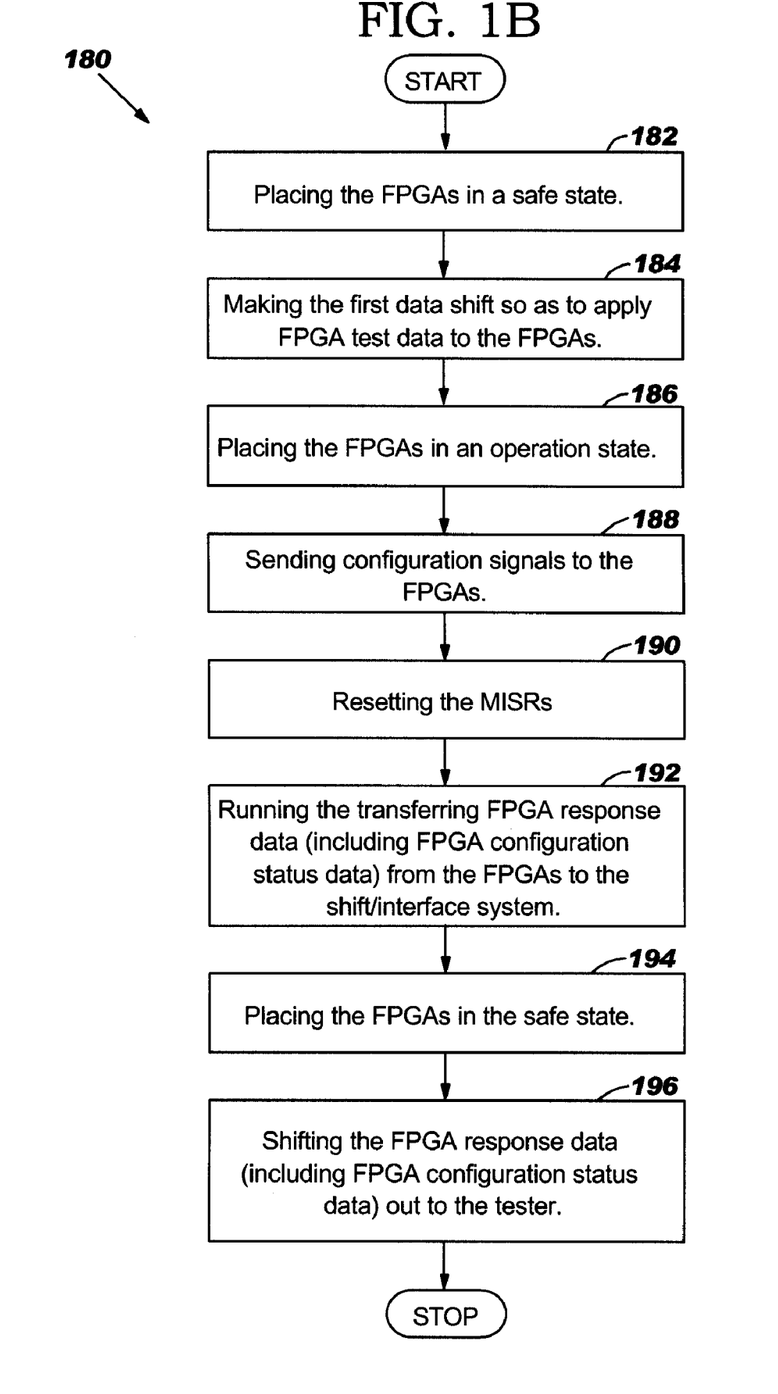
FIG. 1B illustrates a method for operating the testing system of FIG. 1A.

In one embodiment, a structural test 180 (FIG. 1B) of the FPGAs 130a and 130b can be carried out as follows. With reference to FIGS. 1A and 1B, illustratively, in step 182, the tester 120 can place the FPGAs 130a and 130b in a safe (i.e., shut-off) state by sending a stability signal to both the FPGAs 130a and 130b. As a result, random signals on the inputs (not shown) of the FPGAs 130a and 130b would not place the FPGAs 130a and 130b into an unknown or unstable state. In one embodiment, the tester 120 can send the stability signal to both the FPGAs 130a and 130b through the connections 157, the shift/interface system 150, and then the connections 133a and 133b, respectively.

Next, in step 184, with the FPGAs 130a and 130b being placed in the safe state, in one embodiment, the tester 120 can make a first data shift of a first bitstream comprising first FPGA test data and second FPGA test data into the shift/interface system 150 via connection 157. The first data shift is carried out such that, at the end of the first data shift, the first FPGA test data is applied to the input pins of the FPGA 130a via the connections 133a, and the second FPGA test data is applied to the input pins of the FPGA 130b via the connections 133b.

Next, in step 186, in one embodiment, the tester 120 can send an operation signal to the FPGAs 130a and 130b so as to place the FPGAs 130a and 130b in an operation state. In one embodiment, the tester 120 can send the operation signal to the FPGAs 130a and 130b by deactivating the stability signal.

Next, in step 188, in one embodiment, the tester 120 can send configuration signals to the FPGAs 130a and 130b so as to configure the FPGAs 130a and 130b to operate on the first and second FPGA test data, respectively. In one embodiment, the tester 120 can send the configuration signals to the FPGAs 130a and 130b through the connections 157, the shift/interface system 150, and then the connections 133a and 133b, respectively.

Next, in step 190, in one embodiment, the FPGA 130a can send a first reset signal to the MISR 140a via the connections 135a so as to reset the MISR 140a. In one embodiment, the FPGA 130b can send a second reset signal to the MISR 140b via the connections 135b so as to reset the MISR 140b.

Next, in step 192, in one embodiment, the FPGAs 130a and 130b and the MISRs 140a and 140b are clocked N times (N can be selected based on the design of the FPGAs 130a and 130b). In one embodiment, the FPGAs 130a and 130b and the MISRs 140a and 140b can be clocked by the same clock signal.

In one embodiment, for each of the N clocks, the FPGA 130a generates a different FPGA response to both the MISR 140a (via connections 135a) and the shift/interface system 150 (via connections 133a). At the shift/interface system 150, the current FPGA response overrides and replaces the previous FPGA response. But, at the MISR 140a, the current FPGA response is combined with all previous FPGA responses from the FPGA 130a such that after the N clocks, the MISR 140a combines all the N FPGA responses from the FPGA 130a into a first response signature. In one embodiment, after the N clocks, the FPGA 130a can also send its configuration status from its configuration status outputs to the shift/interface system 150 via connections 133a.

Similarly, for each of the N clocks, the FPGA 130b generates a different FPGA response to both the MISR 140b (via connections 135b) and the shift/interface system 150 (via connections 133b). At the shift/interface system 150, the current FPGA response overrides and replaces the previous FPGA response. But, at the MISR 140b, the current FPGA response is combined with all previous responses such that after the N clocks, the MISR 140b combines all the N responses from the FPGA 130b into a second response signature. In one embodiment, after the N clocks, the FPGA 130b can also send its configuration status from its configuration status outputs to the shift/interface system 150 via connections 133b.

Next, in step 194, in one embodiment, the tester 120 can send the stability signal to both the FPGAs 130a and 130b to place the FPGAs 130a and 130b in the safe state.

Next, in step 196, in one embodiment, the shift/interface system 150 can make a second data shift of a second bitstream comprising the first and second response signatures and the configuration status of the FPGA 130a and 130b out of the shift/interface system 150 to the tester 120 via connections 157.

Next, in one embodiment, one or more structural test of the FPGAs 130a and 130b similar to the structural test 180 described supra can be performed.

FIGS. 2A-2E, respectively, illustrate five shift/interface circuits 151a, 151b, 151c, 151d, and 151e representative of five different types of shift/interface circuits of the shift/interface system 150 of FIG. 1A (hereafter also referred to as types 151a, 151b, 151c, 151d, and 151e), in accordance with embodiments of the present invention. Hereafter, a shift/interface circuit of any of the five types above can be referred to as the shift/interface circuit 151.

Figure 2A:
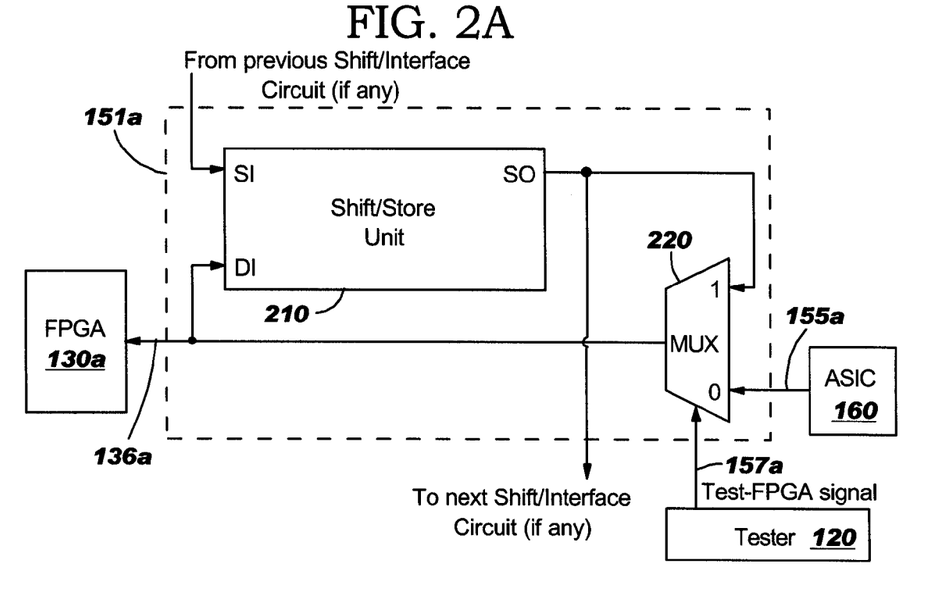
FIGS. 2A-2E illustrate embodiments of shift/interface circuits of the shift/interface system of FIG. 1A, in accordance with embodiments of the present invention.
Figure 2B:
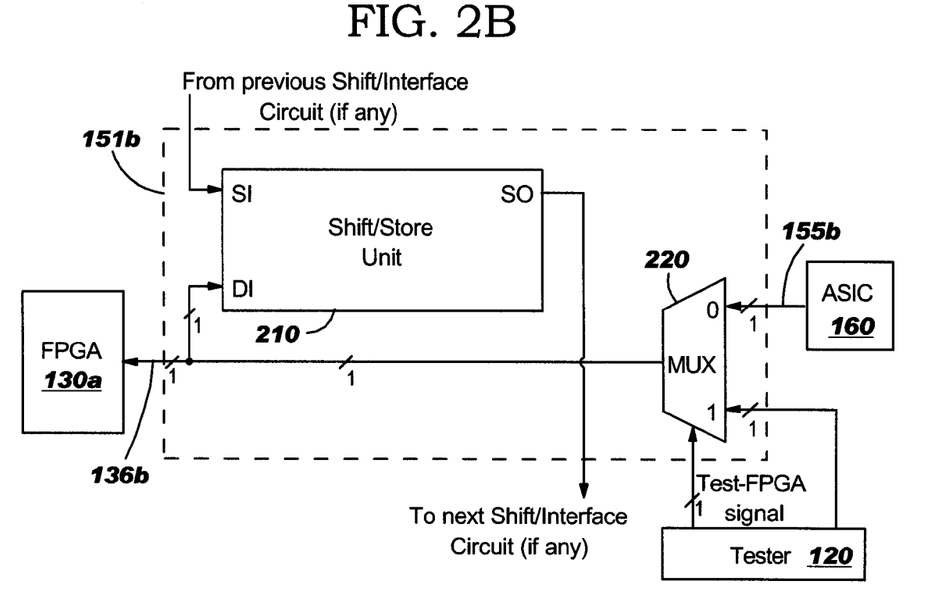
Figure 2C:
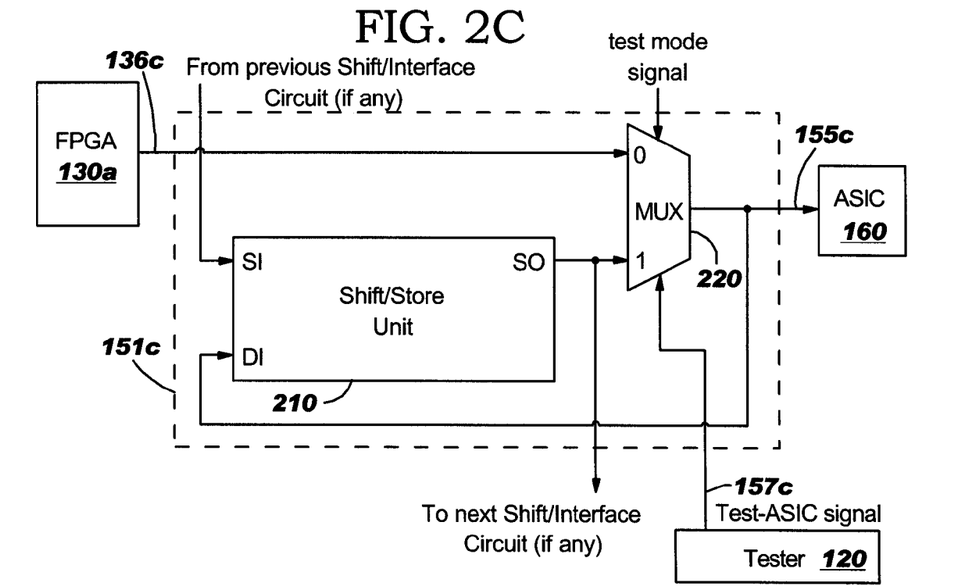

In one embodiment, the shift/interface system 150 of FIG. 1A can comprise one chain of multiple shift/interface circuits 151 each of which can be of any one of the five types 151a, 151b, 151c, 151d, and 151e (FIGS. 2A, 2B, 2C, 2D, and 2E, respectively). For example, one shift/interface circuit 151 in the chain can be of type 151a (FIG. 2A), while the next shift/interface circuit 151 in the chain can be of type 151c (FIG. 2C).

In one embodiment, the chain can have none, one, or more shift/interface circuits 151 of each type of the five types 151a, 151b, 151c, 151d, and 151e (FIGS. 2A, 2B, 2C, 2D, and 2E, respectively).

In one embodiment, the shift/interface circuits 151 of a same type are arranged electrically next to each other in the chain. For example, all shift/interface circuits 151 of type 151a (FIG. 2A) of the chain can be placed electrically next to each other in the chain (two shift/interface circuits 151 are electrically next to each other in the chain if an output of one of the two shift/interface circuits 151 is electrically and directly coupled to an input of the other).

In one embodiment, each shift/interface circuits 151 in the chain, regardless of type, comprises a shift/store unit 210 and a multiplexer (i.e., MUX) 220 (FIGS. 2A-2E). In one embodiment, the shift/store unit 210 can function as a one-bit shift register. That is, in a store mode, the shift/store unit 210 can store a bit applied to its DI input and place the bit on its SO output. In a shift mode, for each shift, the shift/store unit 210 can shift its stored bit at its SO output to the next shift/store unit and receive a bit through its SI input from the immediately preceding shift/store unit.

In one embodiment, the SI input of the shift/store unit 210 of each shift/interface circuit 151 in the chain is electrically and directly coupled to the SO output of the shift/store unit 210 of the previous shift/interface circuit 151 in the chain. Exception is for the first shift/interface circuit 151 in the chain whose SI input (i.e., the SI input of its shift/store unit 210) is electrically coupled to the tester 120 via connections 157. Exception is also for the last shift/interface circuit 151 in the chain whose SO output (i.e., the SO output of its shift/store unit 210) is also electrically coupled to the tester 120 via connections 157.

The following discussion will show how each type of the five types 151a, 151b, 151c, 151d, and 151e (FIGS. 2A, 2B, 2C, 2D, and 2E, respectively) helps in the structural test 180 (FIG. 1B).

FIG. 2A illustrates the shift/interface circuit 151a (i.e., a shift/interface circuit 151 of type 151a) that can be used in the shift/interface system 150 of FIG. 1A, in accordance with embodiments of the present invention. With reference to FIGS. 1A and 2A, for type 151a, in one embodiment, the MUX 220 can have its first and second inputs electrically coupled to an output of the ASIC 160 (via connection 155a, a part of connections 155 of FIG. 1A) and the SO output of the shift/store unit 210, respectively. The MUX 220 can have its output electrically coupled to an input of the FPGA 130a (via connection 136a, a part of connections 133a of FIG. 1A) and to the DI input of the shift/store unit 210. The MUX 220 can have its control input receiving a Test-FPGA signal from the tester 120 via connection 157a, a part of connections 157 of FIG. 1A. In short, the output of the ASIC 160 is coupled to the input of the FPGA 130a via the shift/interface circuit 151 of type 151a.

In one embodiment, assume that the FPGA 130a has P functional data inputs that need to be directly coupled one-to-one to P functional data outputs of the ASIC 160 during the normal operation of the IC 110 of FIG. 1A (P is a positive integer). As a result, P shift/interface circuits 151 of type 151a can be used in the chain to couple the P functional data outputs of the ASIC 160 to the P functional data inputs of the FPGA 130a.

During the normal operation of the IC 110, with reference to FIGS. 1A and 2A, the tester 120 can pull the Test-FPGA signal low (i.e., 0) to cause the P MUXes 220 of the P shift/interface circuits 151 of type 151a to electrically couple the P functional data outputs of the ASIC 160 to the P functional data inputs of the FPGA 130a. In other words, during the normal operation of the IC 110, the shift/interface system 150 is transparent to the FPGA 130a and the ASIC 160 as far as the functional data is concerned.

During the structural test 180 (FIG. 1B) of the FPGA 130a, in step 184, in one embodiment, after the first data shift, the P shift/store units 210 of the P shift/interface circuits 151 of type 151a of the chain should contain the first FPGA test data. Then, with the Test-FPGA signal pulled high by the tester 120, the P MUXes 220 of the P shift/interface circuits 151 of type 151a apply the first FPGA test data (at the P SO outputs of the P shift/store units 210) to the P functional data inputs of the FPGA 130a.

During the testing of the ASIC 160, the tester 120 can pull the Test-FPGA signal low (i.e., 0) to electrically couple the P outputs of the ASIC 160 to the P DI inputs of the P shift/interface circuits 151 of type 151a. As a result, signals on the P outputs of the ASIC 160 can be stored in the P shift/interface circuits 151 of type 151a and can be later shifted out to the tester 120 for analysis.

In one embodiment, multiple shift/interface circuits 151 of type 151a can also be used to couple functional data outputs of the ASIC 160 to functional data inputs of the FPGA 130b in a manner similar to that for the FPGA 130a. In one embodiment, the testing of the FPGAs 130a and 130b can be carried out simultaneously in a similar manner.

FIG. 2B illustrates the shift/interface circuit 151b (i.e., a shift/interface circuit 151 of type 151b) that can be used in the shift/interface system 150 of FIG. 1A, in accordance with embodiments of the present invention. With reference to FIGS. 1A and 2B, for type 151b, in one embodiment, the MUX 220 can have its first and second inputs electrically coupled to an output of the ASIC 160 (via connection 155b, a part of connections 155 of FIG. 1A) and an output of the tester 120, respectively. The MUX 220 can have its output electrically coupled to the input DI of the shift/store unit 210 and an input of the FPGA 130a via connection 136b, a part of connections 133a of FIG. 1A. The MUX 220 can have its control input receiving the Test-FPGA signal from the tester 120. In short, the output of the ASIC 160 is coupled to the input of the FPGA 130a via the shift/interface circuit 151 of type 151b.

In one embodiment, assume that the FPGA 130a has Q configuration inputs that need to be directly coupled one-to-one to Q configuration outputs of the ASIC 160 during the normal operation of the IC 110 of FIG. 1A (Q is a positive integer). As a result, Q shift/interface circuits 151 of type 151b can be used in the chain to couple the Q configuration outputs of the ASIC 160 to the Q configuration inputs of the FPGA 130a.

During the normal operation of the IC 110, with reference to FIGS. 1A and 2B, the tester 120 can pull the Test-FPGA signal low (i.e., 0) to cause the Q MUXes 220 of the Q shift/interface circuits 151 of type 151b to electrically couple the Q configuration outputs of the ASIC 160 to the Q configuration inputs of the FPGA 130a. In other words, during the normal operation of the IC 110, the shift/interface system 150 is transparent to the FPGA 130a and the ASIC 160 as far as the configuration data is concerned.

During the structural test 180 (FIG. 1B) of the FPGA 130a, in step 188, in one embodiment, with the Test-FPGA signal being high, the Q MUXes 220 of the Q shift/interface circuits 151 of type 151b can apply the Q configuration signal bits from the tester 120 to the Q configuration inputs of the FPGA 130a. During the structural test 180 (FIG. 1B), the tester 120 can change the configuration signal bits sent to the FPGA 130a.

During the testing of the ASIC 160, the tester 120 can pull the Test-FPGA signal low (i.e., 0) to electrically couple the Q outputs of the ASIC 160 to the Q DI inputs of the Q shift/interface circuits 151 of type 151b. As a result, signals on the Q outputs of the ASIC 160 can be stored in the Q shift/interface circuits 151 of type 151b and can be later shifted out to the tester 120 for analysis.

In one embodiment, multiple shift/interface circuits 151 of type 151b can also be used to couple configuration outputs of the ASIC 160 to configuration inputs of the FPGA 130b in a manner similar to that for the FPGA 130a. In one embodiment, the testing of the FPGAs 130a and 130b can be carried out simultaneously in a similar manner.

FIG. 2C illustrates the shift/interface circuit 151c (i.e., a shift/interface circuit 151 of type 151c) that can be used in the shift/interface system 150 of FIG. 1A, in accordance with embodiments of the present invention. With reference to FIGS. 1A and 2C, for type 151c, in one embodiment, the MUX 220 can have its first and second inputs electrically coupled to an output of the FPGA 130a (via connection 136c, a part of connections 133a of FIG. 1A) and the SO output of the shift/store unit 210, respectively. The MUX 220 can have its output electrically coupled to an input of the ASIC 160 (via connection 155c, a part of connections 155 of FIG. 1A) and to the DI input of the shift/store unit 210. In one embodiment, the MUX 220 can have its output further electrically coupled directly to the tester 120 via a connection (not shown). As a result, the tester 120 can continuously monitor the output of the FPGA 130a as long as the MUX 220 selects the output of the FPGA 130a. The MUX 220 can have its control input receiving a Test-ASIC signal from the tester 120 via connection 157c, a part of connections 157 of FIG. 1A. In short, the output of the FPGA 130a is coupled to the input of the ASIC 160 via the shift/interface circuit 151 of type 151c.

In one embodiment, assume that the FPGA 130a has R configuration status outputs that need to be directly coupled one-to-one to R configuration status inputs of the ASIC 160 during the normal operation of the IC 110 of FIG. 1A (R is a positive integer). Assume further that the FPGA 130a has S functional data outputs that need to be electrically coupled one-to-one to S functional data inputs of the ASIC 160 during the normal operation of the IC 110 of FIG. 1A (S is a positive integer). As a result, R shift/interface circuits 151 of type 151c can be used in the chain to couple the R configuration status outputs of the FPGA 130a to the R configuration status inputs of the ASIC 160. Also, S shift/interface circuits 151 of type 151c can be used in the chain to couple the S functional data outputs of the FPGA 130a to the S functional data inputs of the ASIC 160.

During the normal operation of the IC 110, with reference to FIGS. 1A and 2C, the tester 120 can pull the Test-ASIC signal low (i.e., 0) to cause the R+S MUXes 220 of the R+S shift/interface circuits 151 of type 151c to electrically couple the R configuration status outputs and S functional data outputs of the FPGA 130a to the R configuration status inputs and S functional data inputs of the ASIC 160, respectively. In other words, during the normal operation of the IC 110, the shift/interface system 150 is transparent to the FPGA 130a and the ASIC 160 as far as the FPGA configuration status data and the FPGA functional output data are concerned.

During the structural test 180 (FIG. 1B) of the FPGA 130a, in step 192, in one embodiment, the tester 120 can pull the Test-ASIC signal low (i.e., 0) to cause the R+S MUXes 220 of the R+S shift/interface circuits 151 of type 151c to electrically couple the R configuration status outputs and S functional data outputs of the FPGA 130a to the R+S DI inputs of the R+S shift/store units 210 of the R+S shift/interface circuits 151 of type 151c. As a result, configuration status data from the FPGA 130a can be transmitted to and stored in the R shift/interface circuits 151 of type 151c of the chain and can be later shifted out to the tester 120 for analysis (as part of the second bitstream). Similarly, the FPGA responses at the S functional data outputs of the FPGA 130a can be transmitted to the S shift/interface circuits 151 of type 151c of the chain, and the last FPGA response of the FPGA 130a can be later shifted out to the tester 120 for analysis (as part of the second bitstream).

During the testing of the ASIC 160, the tester 120 can pull the Test-ASIC signal high (i.e., 1) to electrically couple the R+S inputs of the ASIC 160 to the R+S SO outputs of the R+S shift/interface circuits 151 of type 151c. As a result, ASIC test data can be shifted into the shift/interface system 150 from the tester 120 (in one embodiment, as part of the first bitstream) and then applied to the R+S inputs of the ASIC 160 via the R+S MUXes 220 of the R+S shift/interface circuits 151 of type 151c.

In one embodiment, multiple shift/interface circuits 151 of type 151c can also be used to couple configuration status outputs and functional data outputs of the FPGA 130b (FIG. 1A) to configuration status inputs and functional data inputs of the ASIC 160, respectively, in a manner similar to that for the FPGA 130a. In one embodiment, the testing of the FPGAs 130a and 130b can be carried out simultaneously in a similar manner.

Figure 2D:
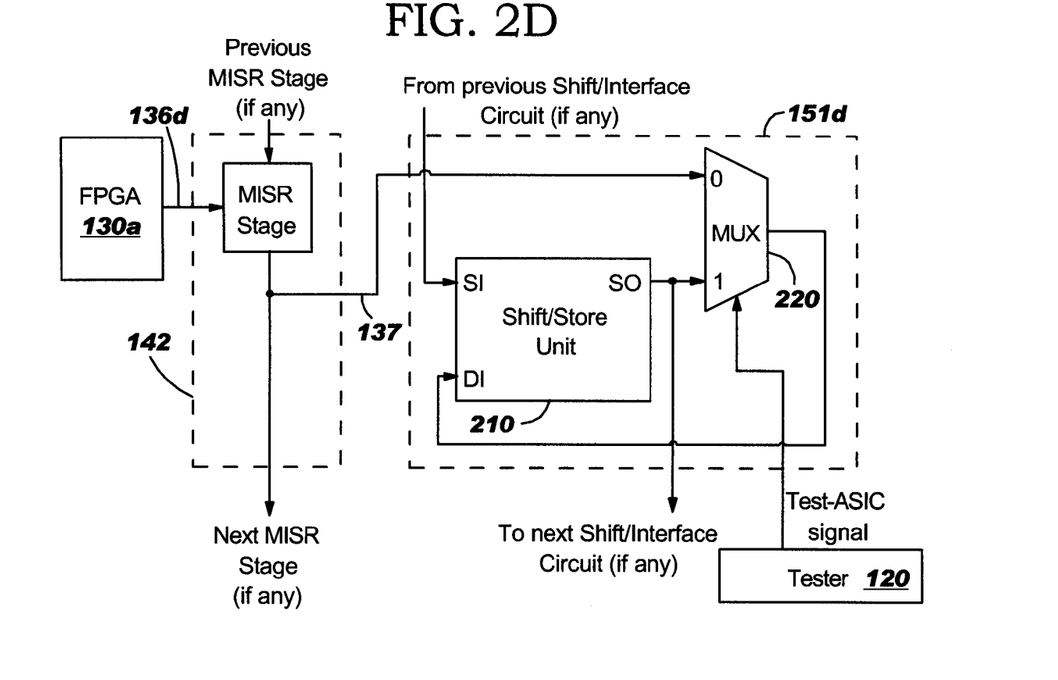

FIG. 2D illustrates the shift/interface circuit 151d (i.e., a shift/interface circuit 151 of type 151d) that can be used in the shift/interface system 150 of FIG. 1A and a MISR stage 142 that can be used in the MISR 140a of FIG. 1A, in accordance with embodiments of the present invention.

In one embodiment, S MISR stages (not shown) like the MISR stage 142 (or in short, the S MISR stages 142) can be coupled together in daisy chain to form the MISR 140a of FIG. 1A. In one embodiment, the S MISR stages 142 can be coupled one-to-one to the S functional data outputs (described above) of the FPGA 130a and also coupled one-to-one to S shift/interface circuits 151 of type 151d.

In one embodiment, the shift/interface circuit 151d has a structure similar to the shift/interface circuit 151c (FIG. 2C), except that in the shift/interface circuit 151d, the first input of the MUX 220 is coupled to an output of the associated MISR stage 142 (via connection 137) and the output of the MUX 220 is not coupled to the ASIC 160.

During the structural test 180 (FIG. 1B) of the FPGA 130a, in step 192, in one embodiment, FPGA responses on the S functional data outputs of the FPGA 130a can be transmitted via connection 136d to the S associated MISR stages 142 to be processed into the first FPGA response signature. More specifically, when a current FPGA response at the S functional data outputs of the FPGA 130a is transmitted to the S associated MISR stages 142, the S MISR stages 142 combine the current FPGA response with the previous FPGA response signature to form a current FPGA response signature. At the end, the first FPGA response signature is created at the S outputs of the S MISR stages 142. With the Test-ASIC signal pulled low (i.e., 0) by the tester 120, the S MUXes 220 of the S shift/interface circuits 151 of type 151d apply the first FPGA response signature from the S MISR stages 142 to the S DI inputs of the S shift/interface circuits 151 of type 151d. In step 196 (FIG. 1 B), the first FPGA response signature is shifted out to the tester 120 for analysis (as part of the second bitstream).

In one embodiment, T more MISR stages 142 (T being a positive integer) can be added to the end of the chain of the S MISR stages 142 so as to reduce the chance of response signature alias. As a result, T more shift/interface circuits 151 of type 151d corresponding to the T additional MISR stages 142 can be added to the chain. The first FPGA response signature therefore has S+T bits instead of S bits.

In one embodiment, multiple shift/interface circuits 151 of type 151d and multiple MISR stages 142 can also be coupled to functional data outputs of the FPGA 130b in a manner similar to that for the FPGA 130a. In one embodiment, the testing of the FPGAs 130a and 130b can be carried out simultaneously in a similar manner with respect to FPGA response signature formation.

Figure 2E:
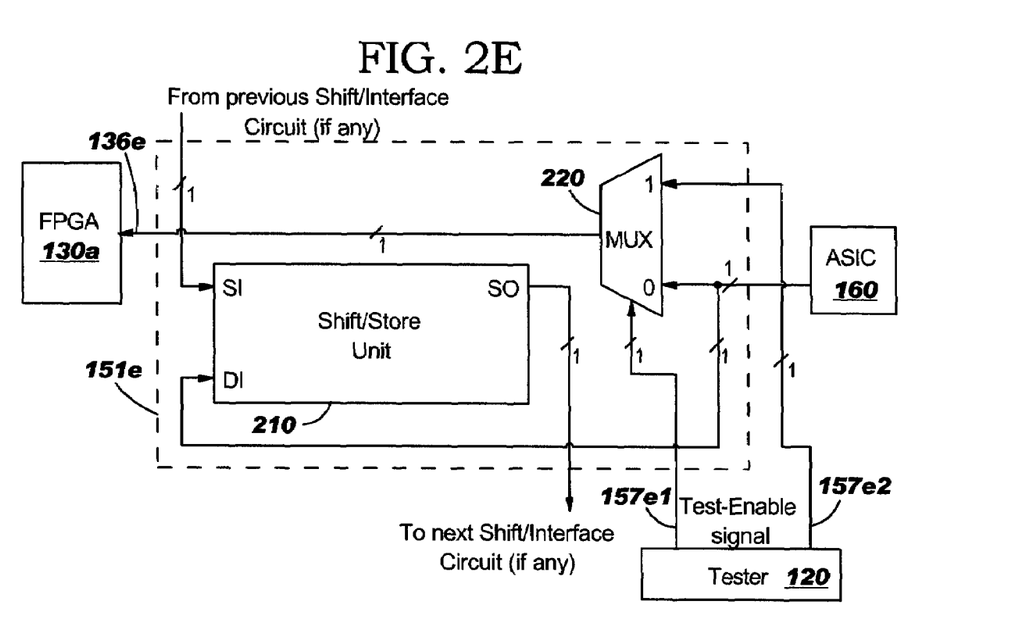

FIG. 2E illustrates the shift/interface circuit 151e (i.e., a shift/interface circuit 151 of type 151e) that can be used in the shift/interface system 150 of FIG. 1A, in accordance with embodiments of the present invention. With reference to FIGS. 1A and 2E, for type 151e, in one embodiment, the MUX 220 can have its first and second inputs electrically coupled to an output of the ASIC 160 and an output of the tester 120 (via connection 157e2, apart of the connections 157 of FIG. 1A), respectively. The output of the ASIC 160 is also electrically coupled to the DI input of the shift/store unit 220. The MUX 220 can have its output electrically coupled to an input of the FPGA 130a via connection 136e. The MUX 220 can have its control input receiving a Test-Enable signal from the tester 120 via connection 157e1, a part of connections 157 of FIG. 1A. In one embodiment, the input of the FPGA 130a can be a stability input of the FPGA 130a for receiving the stability signal from the tester 120.

During the normal operation of the IC 110, with reference to FIGS. 1A and 2E, the tester 120 can pull the Test-Enable signal low (i.e., 0) to cause the MUX 220 of the shift/interface circuit 151e to electrically couple the output of the ASIC 160 to the stability input of the FPGA 130a.

During the structural test 180 (FIG. 1B) of the FPGA 130a, in steps 182 and 194 in one embodiment, the tester 120 can pull the Test-Enable signal high and also assert the stability signal on the connection 157e2. As a result, the asserted stability signal is transmitted to the stability input of the FPGA 130a via the MUX 220 of the shift/interface circuit 151e. Therefore, the FPGA 130a is placed in the stable state. In one embodiment, in step 186 of the structural test 180 (FIG. 1B), the tester 120 can pull the Test-Enable signal high and also deactivate the stability signal on the connection 157e2. As a result, the FPGA 130a is placed in the operation state.

During the testing of the ASIC 160, the shift/store unit 220 can store the bit from the output of the ASIC 160. Later, the stored bit can be shifted out to the tester 120 for analysis.

In one embodiment, another shift/interface circuit 151 of type 151e can also be used for a stability input of the FPGA 130b in a manner similar to that for the FPGA 130a. In one embodiment, the testing of the FPGAs 130a and 130b can be carried out simultaneously in a similar manner.

Figure 3:
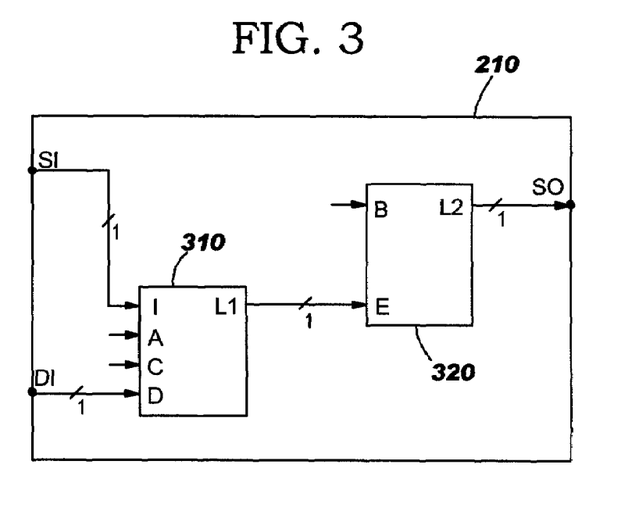
FIG. 3 illustrates one embodiment of a shift/store unit that can be used in the shift/interface circuits of FIGS. 2A-2E, in accordance with embodiments of the present invention.

FIG. 3 illustrates one embodiment of the shift/store unit 210 that can be used in the shift/interface circuits 151a, 151b, 151c, 151d, and 151e of FIGS. 2A-2E, respectively, in accordance with embodiments of the present invention. In one embodiment, the shift/store unit 210 can comprise latches 310 and 320. The latch 310 can have four inputs I, A, C, and D and one output L1, whereas the latch 320 has two inputs B and E and one output L2.

The inputs SI and DI of the shift/store unit 210 can be electrically coupled to inputs I and D of the latch 310, respectively. The output L1 of the latch 310 is electrically coupled to input E of the latch 320. The output L2 of the latch 320 is electrically coupled to the output SO of the shift/store unit 210. The inputs A, B, and C can be control inputs which can be electrically coupled to the tester 120 via connections 157 (FIG. 1A).

In one embodiment, for the latch 310, if A=1 (i.e., logic high) and C=0 (i.e., logic low), then the output L1 is electrically coupled to input I (i.e., L1=I). If A=0 and C=1, then L1=D. If A=C=0, then L1 remains at its current state. The case A=C=1 is not allowed. In one embodiment, for the latch 320, if B=1, then L2=E. If B=0, L2 is electrically decoupled from E.

In the embodiments described above, all the shift/interface circuits 151 (FIGS. 2A-2E) of the shift/interface system 150 (FIG. 1A) are coupled together in a single chain. Alternatively, the shift/interface circuits 151 can be coupled together in multiple chains each of which can start from and end at the tester 120. In one embodiment, latches in the ASIC 160 (FIG. 1A) can also be included in the chain(s) of the shift/interface circuits 151.

In the embodiments described above, with reference to FIG. 1A, the FPGAs 130a and 130b are shown separate from the ASIC 160. Alternatively, the FPGAs 130a and 130b can be embedded in the ASIC 160.

In the embodiments described above, with reference to FIG. 1A, the FPGAs 130a and 130b are used for illustration. In general, the present invention is applicable to any macro circuits (not just FPGAs). A macro circuit is itself an integrated circuit (IC). A macro circuit can be integrated in another integrated circuit.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A digital system, comprising:
(a) N macro circuits, N being a positive integer;
(b) an application-specific integrated circuit (ASIC); and
(c) a shift/interface system being coupled to the N macro circuits and the ASIC,
wherein, in response to the N macro circuits and the ASIC being in normal operation, the shift/interface system electrically couples each macro circuit of the N macro circuits to the ASIC,
wherein, in response to the N macro circuits being tested, the shift/interface system is further configured to scan-in macro circuit test data in series, then to feed the macro circuit test data to the N macro circuits, then to receive macro circuit response data from the N macro circuits, and then to scan-out the macro circuit response data in series,
wherein, in response to the ASIC being tested, the shift/interface system is further configured to scan-in ASIC test data in series, then to feed the ASIC test data to the ASIC, then to receive ASIC response data from the ASIC, and then to scan-out the ASIC response data in series,
wherein the shift/interface system comprises $\Sigma L_i$ (i=1, 2, . . . , N) shift/interface circuits,
wherein, for i=1,2, . . . , N, $L_i$ is a positive integer, the $L_i$ shift/interface circuits being coupled one-to-one to $L_i$ input pins of the $i^{th}$ macro circuit of the N macro circuits, being coupled one-to-one to $L_i$ output pins of the ASIC, and being electrically coupled together in a chain,
wherein, for i=1,2, . . . , N, and for j=1,2, . . . , $L_i$, an $ij^{th}$ shift/interface circuit of the $L_i$ shift/interface circuits comprises an $ij^{th}$ shift/store unit and an $ij^{th}$ multiplexer,
wherein, for i=1,2, . . . , N, in response to the $i^{th}$ macro circuit and the ASIC being in normal operation, for j=1,2, . . . , $L_i$, the $ij^{th}$ multiplexer electrically couples an associated $ij^{th}$ output pin of the $L_i$ output pins of the ASIC to an associated $ij^{th}$ input pin of the $L_i$ input pins of the $i^{th}$ macro circuit, wherein, for i=1,2, ..., N, in response to the $i^{th}$ macro circuit being tested, for j=1,2, ..., $L_i$, the $ij^{th}$ shift/store unit, is configured to scan-in a test bit, and the $ij^{th}$ multiplexer is further configured to transmit the test bit from the $ij^{th}$ shift/store unit to the $ij^{th}$ input pin of the $L_i$ input pins of the $i^{th}$ macro circuit, and wherein, for i=1,2, ..., N, in response to the ASIC being tested, for j=1,2, ..., $L_i$, the $ij^{th}$ multiplexer is further configured to transmit a response bit from the $ij^{th}$ output pin of the ASIC to the $ij^{th}$ shift/store unit, and the $ij^{th}$ shift/store unit is further configured to receive and scan-out the response bit.

2. A digital system, comprising:

(a) N macro circuits, N being a positive integer;

(b) an application-specific integrated circuit (ASIC); and (c) a shift/interface system being coupled to the N macro circuits and the ASIC, wherein, in response to the N macro circuits and the ASIC being in normal operation, the shift/interface system electrically couples each macro circuit of the N macro circuits to the ASIC, wherein, in response to the N macro circuits being tested, the shift/interface system is further configured to scan-in macro circuit test data in series, then to feed the macro circuit test data to the N macro circuits, then to receive macro circuit response data from the N macro circuits, and then to scan-out the macro circuit response data in series, wherein, in response to the ASIC being tested, the shift/interface system is further configured to scan-in ASIC test data in series, then to feed the ASIC test data to the ASIC, then to receive ASIC response data from the ASIC, and then to scan-out the ASIC response data in series, wherein the shift/interface system comprises $\Sigma M_i$ (i=1,2, ..., N) shift/interface circuits, wherein, for i=1,2, ..., N, $M_i$ is a positive integer, the $M_i$ shift/interface circuits being coupled one-to-one to $M_i$ input pins of the $i^{th}$ macro circuit, being coupled one-to-one to $M_i$ output pins of the ASIC, being coupled one-to-one to $M_i$ output pins of a testing circuit, and being electrically coupled together in a chain, wherein, for i=1,2, ..., N, and for k=1,2, ..., $M_i$, an $ik^{th}$ shift/interface circuit of the $M_i$ shift/interface circuits comprises an $ik^{th}$ shift/store unit and an $ik^{th}$ multiplexer, wherein, for i=1,2, ..., N, in response to the $i^{th}$ macro circuit and the ASIC being in normal operation, for k=1,2, ..., $M_i$, the $ik^{th}$ multiplexer electrically couples an associated $ik^{th}$ output pin of the $M_i$ output pins of the ASIC to an associated $ik^{th}$ input pin of the $M_i$ input pins of the $i^{th}$ macro circuit, wherein, for i=1,2, ..., N, in response to the $i^{th}$ macro circuit being tested, for k=1,2, ..., $M_i$, the $ik^{th}$ multiplexer electrically couples the $ik^{th}$ output pin of the $M_i$ output pins of the testing circuit to the $ik^{th}$ input pin of the $M_i$ input pins of the $i^{th}$ macro circuit, and wherein, for i=1,2, ..., N, in response to the ASIC being tested, for k=1,2, ..., $M_i$, the $ik^{th}$ multiplexer is further configured to transmit a response bit from the $ik^{th}$ output pin of the ASIC to the $ik^{th}$ shift/store unit, and the $ik^{th}$ shift/store unit is further configured to receive and scan-out the response bit.

3. A digital system, comprising:

(a) N macro circuits, N being a positive integer;

(b) an application-specific integrated circuit (ASIC); and (c) a shift/interface system being coupled to the N macro circuits and the ASIC, wherein, in response to the N macro circuits and the ASIC being in normal operation, the shift/interface system electrically couples each macro circuit of the N macro circuits to the ASIC, wherein, in response to the N macro circuits being tested, the shift/interface system is further configured to scan-in macro circuit test data in series, then to feed the macro circuit test data to the N macro circuits, then to receive macro circuit response data from the N macro circuits, and then to scan-out the macro circuit response data in series, wherein, in response to the ASIC being tested, the shift/interface system is further configured to scan-in ASIC test data in series, then to feed the ASIC test data to the ASIC, then to receive ASIC response data from the ASIC, and then to scan-out the ASIC response data in series, wherein the shift/interface system comprises $\Sigma P_i$ (i=1,2, ..., N) shift/interface circuits, wherein, for i=1,2, ..., N, $P_i$ is a positive integer, the $P_i$ shift/interface circuits are coupled one-to-one to $P_i$ output pins of the $i^{th}$ macro circuit, are coupled one-to-one to $P_i$ input pins of the ASIC, and are electrically coupled together in a chain, wherein, for i=1,2, ..., N, and for h=1,2, ..., $P_i$, an $ih^{th}$ shift/interface circuit of the $P_i$ shift/interface circuits comprises an $ih^{th}$ shift/store unit and an $ih^{th}$ multiplexer, wherein, for i=1,2, ..., N, in response to the $i^{th}$ macro circuit and the ASIC being in normal operation, for h=1,2, ..., $P_i$, the multiplexer electrically couples an associated $ih^{th}$ input pin of the $P_i$ input pins of the ASIC to an associated $ih^{th}$ output pin of the $P_i$ output pins of the $i^{th}$ macro circuit, wherein, for i=1,2, ..., N, in response to the $i^{th}$ macro circuit being tested, for h=1,2, ..., $P_i$, the $ih^{th}$ multiplexer is further configured to transmit a response bit from the associated $ih^{th}$ output pin of the $P^i$ output pins of the $i^{th}$ macro circuit to the $ih^{th}$ shift/store unit, and the $ih^{th}$ shift/store unit is further configured to receive and scan-out the response bit, and wherein, for i=1,2, ..., N, in response to the ASIC being tested, for h=1,2, ..., $P_i$, the $ih^{th}$ shift/store unit is configured to scan-in a test bit, and the $ih^{th}$ multiplexer is further configured to transmit the test bit from the $ih^{th}$ shift/store unit to the associated $ih^{th}$ input pin of the $P_i$ input pins of the ASIC.

4. The digital system of claim 3, wherein, for i=1, 2, ..., N, at least one of the $P_i$ shift/interface circuits is coupled to a tester and can be used by the tester to monitor an output of the $i^{th}$ macro circuit in response to the $i^{th}$ macro circuit being tested.

5. A digital system, comprising:

(a) N macro circuits, N being a positive integer;

(b) an application-specific integrated circuit (ASIC); and (c) a shift/interface system being coupled to the N macro circuits and the ASIC, wherein, in response to the N macro circuits and the ASIC being in normal operation, the shift/interface system electrically couples each macro circuit of the N macro circuits to the ASIC, wherein, in response to the N macro circuits being tested, the shift/interface system is further configured to scan-in macro circuit test data in series, then to feed the macro circuit test data to the N macro circuits, then to receive macro circuit response data from the N macro circuits, and then to scan-out the macro circuit response data in series, wherein, in response to the ASIC being tested, the shift/interface system is further configured to scan-in ASIC test data in series, then to feed the ASIC test data to the ASIC, then to receive ASIC response data from the ASIC, and then to scan-out the ASIC response data in series, wherein the shift/interface system comprises $\Sigma Q_i$ (i=1,2, ..., N) shift/interface circuits, wherein, for i=1,2, ..., N, $Q_i$ is a positive integer, the $Q_i$ shift/interface circuits being coupled one-to-one to $Q^i$ input pins of the $i^{th}$ macro circuit, being coupled one-to-one to $Q_i$ output pins of the ASIC, being coupled one-to-one to $Q_i$ output pins of a testing circuit, and being electrically coupled together in a chain, wherein, for i=1,2, ..., N, and for m=1,2, ..., $Q_i$, an $im^{th}$ shift/interface circuit of the $Q_i$ shift/interface circuits comprises an $im^{th}$ shift/store unit and an $im^{th}$ multiplexer, wherein, for i=1,2, ..., N, in response to the $i^{th}$ macro circuit and the ASIC being in normal operation, for m=1,2, ..., $Q_i$, the $im^{th}$ multiplexer electrically couples an associated $im^{th}$ output pin of the $Q^i$ output pins of the ASIC to an associated $im^{th}$ input pin of the $Q_i$ input pins of the $i^{th}$ macro circuit, wherein, for i=1,2, ..., N, in response to the $i^{th}$ macro circuit being tested, for m=1,2, ..., $Q_i$, the $im^{th}$ multiplexer electrically couples the $im^{th}$ output pin of the $Q_i$ output pins of the testing circuit to the $im^{th}$ pin of the $Q_i$ input pins of the $i^{th}$ macro circuit, and wherein, for i=1,2, ..., N, in response to the ASIC being tested, for m=1,2, ..., $Q_i$ the $im^{th}$ shift/store unit is further configured to receive a response bit from the $im^{th}$ output pin of the $Q_i$ output pins of the ASIC and then scan-out the response bit.

* * * * *